United States Patent
Shuey et al.

[11] Patent Number: 5,907,241
[45] Date of Patent: May 25, 1999

[54] CURRENT MEASUREMENT METHODS AND APPARATUS EMPLOYING SECOND HARMONIC SCALING

[75] Inventors: Kenneth C. Shuey; Rodney C. Hemminger, both of Raleigh, N.C.

[73] Assignee: ABB Power T&D Company Inc., Raleigh, N.C.

[21] Appl. No.: 08/908,208

[22] Filed: Aug. 7, 1997

Related U.S. Application Data

[63] Continuation of application No. 08/710,127, Sep. 11, 1996, abandoned.

[51] Int. Cl.$^6$ .................................................... G01R 7/00
[52] U.S. Cl. .......................................................... 324/142
[58] Field of Search ........................... 321/142, 103 R, 321/106, 116, 141; 364/481, 483; 702/74, 64, 85, 90

[56] References Cited

U.S. PATENT DOCUMENTS

| | | | |
|---|---|---|---|
| 4,255,707 | 3/1981 | Miller | 324/142 |
| 4,419,619 | 12/1983 | Jindrick et al. | 323/257 |
| 4,837,504 | 6/1989 | Baer et al. | 324/74 |
| 4,859,936 | 8/1989 | Eccleston | 324/74 |
| 4,884,021 | 11/1989 | Hammond et al. | 324/142 |
| 4,933,631 | 6/1990 | Eccleston | 324/115 |
| 5,059,896 | 10/1991 | Germer et al. | 324/142 |
| 5,124,624 | 6/1992 | De Vries et al. | 324/74 |
| 5,245,275 | 9/1993 | Germer et al. | 324/74 |
| 5,255,202 | 10/1993 | Kido et al. | 364/483 |
| 5,258,704 | 11/1993 | Germer et al. | 324/142 |
| 5,289,115 | 2/1994 | Germer et al. | 324/107 |
| 5,298,888 | 3/1994 | McEachern et al. | 340/660 |
| 5,325,051 | 6/1994 | Germer et al. | 324/142 |
| 5,471,137 | 11/1995 | Briese et al. | 324/158.1 |

*Primary Examiner*—Vinh P. Nguyen
*Attorney, Agent, or Firm*—Woodcock Washburn Kurtz Mackiewicz & Norris LLP

[57] ABSTRACT

A method for measuring an AC current in a conductor in which a DC current also exists includes the steps of (A) obtaining a first AC current measurement; (B) obtaining a measure of a power factor, fundamental frequency component, and second harmonic component; and (C) adjusting the first AC current measurement in accordance with an error value to obtain a corrected current measurement. The error value is determined as a function of the power factor, fundamental frequency component, and second harmonic component.

8 Claims, 4 Drawing Sheets

$$\% \text{ ERROR} = 187 * \left[\frac{V_{f2}}{V_{f1}}\right] \text{ FOR } I_{DC} < 50\% I_{AC}$$

60° LAGGING

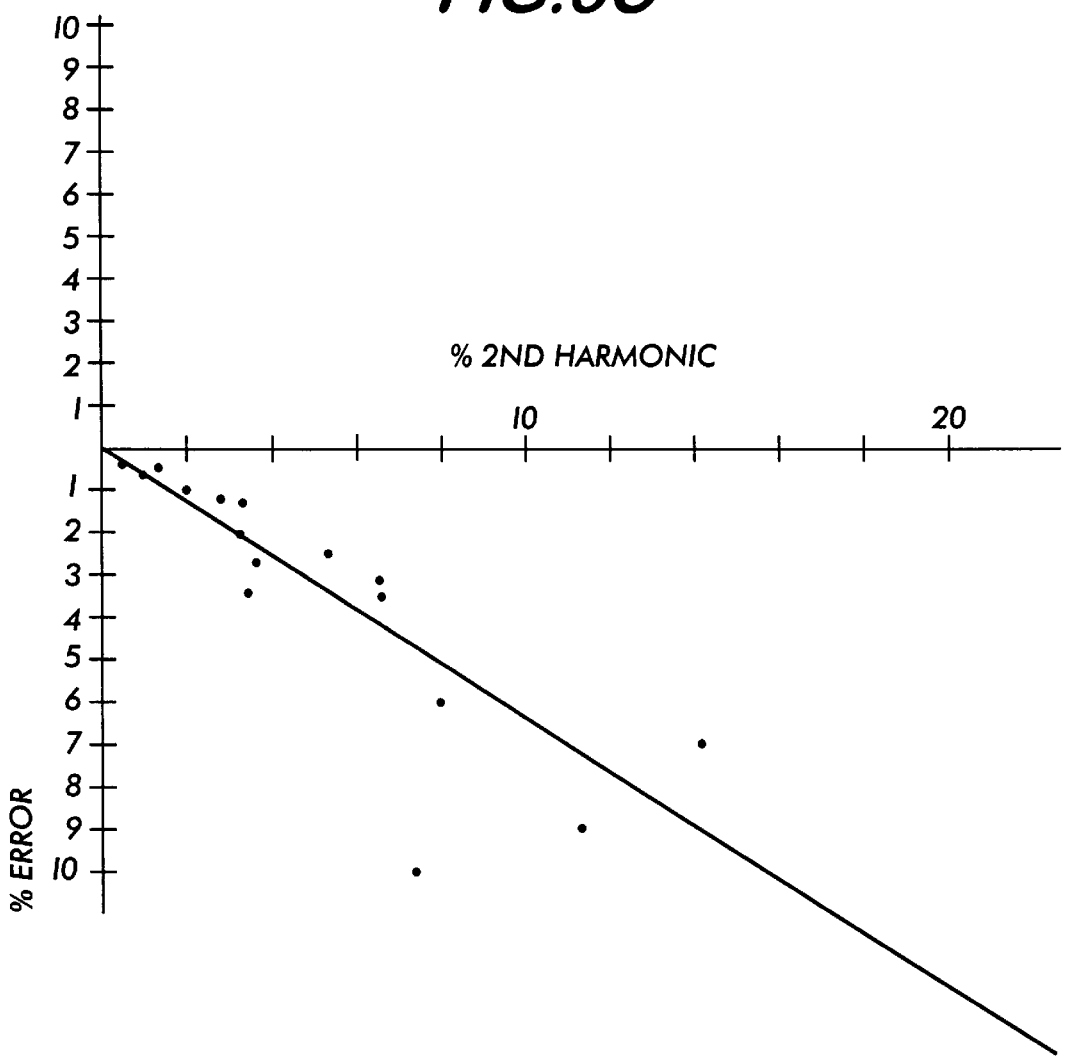

CURRENT MEASUREMENT METHODS AND APPARATUS EMPLOYING SECOND HARMONIC SCALING

CROSS-REFERENCE TO RELATED APPLICATION

This is a continuation application of Ser. No. 08/710,127, filed Sep. 11, 1996, now abandoned.

FIELD OF THE INVENTION

The present invention relates generally to the field of current metering, and more particularly to methods and apparatus for obtaining accurate power frequency current measurements when DC current is also present.

BACKGROUND OF THE INVENTION

Electronic metering of electrical energy is a mature field of technology, and today's metering products must minimize hardware cost to be competitive. Typically, one of the major cost elements in a current or Watt-hour meter is the current transformer responsible for accurately reproducing the waveforms of the current to be measured. Normally, the current to be measured is the current component at the power frequency, 60 Hz for systems in the United States and 50 Hz for many international systems. However, in addition to the power frequency currents, there are harmonic currents and DC currents that can be present. These harmonic and DC currents can adversely affect the performance of current transformers designed to operate at the power frequency. This is a particularly serious concern where extremely accurate billing information is required.

Previous metering technologies have used a variety of current sensing techniques. Generally, these techniques offer a compromise of accuracy for power frequency current with and without DC current present. The DC current tends to saturate magnetic materials, and consequently it adversely affects accuracy. Typical current sensing materials, such as Supermalloy, tend to be expensive and are priced proportional to weight or volume. Accordingly, a consequence of the presence of DC current is the need for more magnetic material to obtain the same AC accuracy, which in turn results in higher costs. Therefore, a need exists for a current measurement technique that will improve power frequency metering accuracy in the presence of DC current.

SUMMARY OF THE INVENTION

Accordingly, an object of the present invention is to provide a system and method whereby the current transformer may be sized for AC current only and the measurement result may be compensated when there is DC current present.

The present invention provides a method and system for measuring an AC current in a conductor in which a DC current also exists. The invention includes the steps of, or means for, obtaining a first AC current measurement; obtaining a measure of a power factor, fundamental frequency component, and second harmonic component; and adjusting the first AC current measurement in accordance with an error value to obtain a corrected current measurement. The error value is determined as a function of the power factor, fundamental frequency component, and second harmonic component.

In a presently preferred embodiment of the invention, the first AC current measurement is obtained with a current transformer operatively coupled to the conductor, and the output of the current transformer is a signal ($V_{CT}$) indicative of the AC current in the conductor. Further, in this preferred embodiment, the error value is determined in accordance with the following equation:

$$\% \text{Error} = \left(-68 + \frac{(2.8 * \text{pwr factor in degrees})}{(1 + 2 * (V_{2nd\,harm} / V_{fund}))}\right) * (V_{2nd\,harm} / V_{fund})$$

wherein "%Error" represents the percent error in the first current measurement and "$V_{2nd\,harm}/V_{fund}$" represents a ratio of the second harmonic component to the fundamental frequency component. Alternatively, the power factor, fundamental frequency component, and second harmonic component are employed to access a lookup table containing the error value. Other features of the invention are disclosed below.

BRIEF DESCRIPTION OF THE DRAWINGS

FIGS. 3A–3C are data plots of the performance data for a solid state meter operating over a wide variety of different loading conditions. (These graphs are examples of typical data that could be used for the development of error correction data.)

DETAILED DESCRIPTION OF THE PREFERRED EMBODIMENTS

Figure 1:
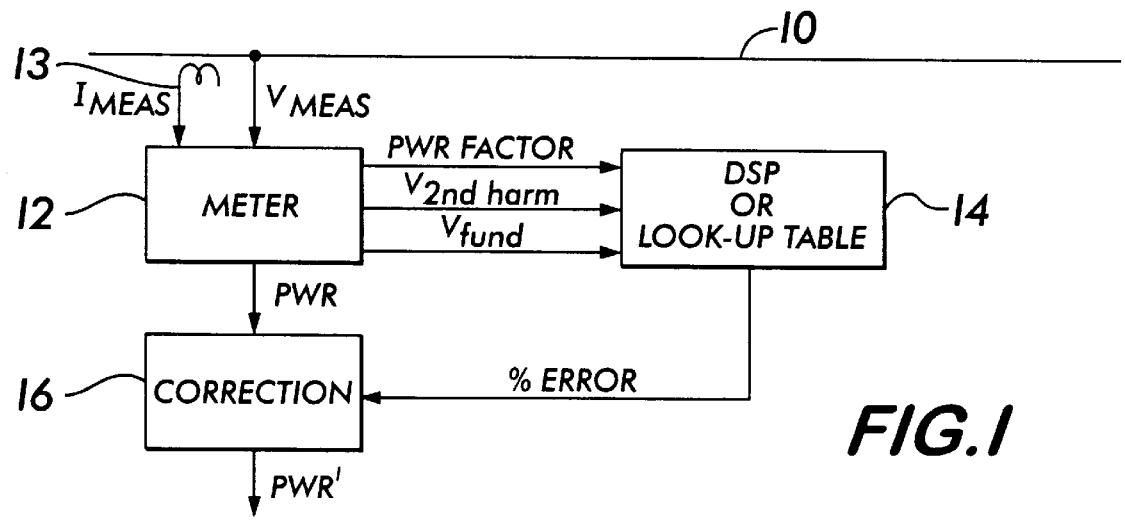
FIG. 1 is a block diagram of a current measuring system in accordance with the present invention.
Figure 2:
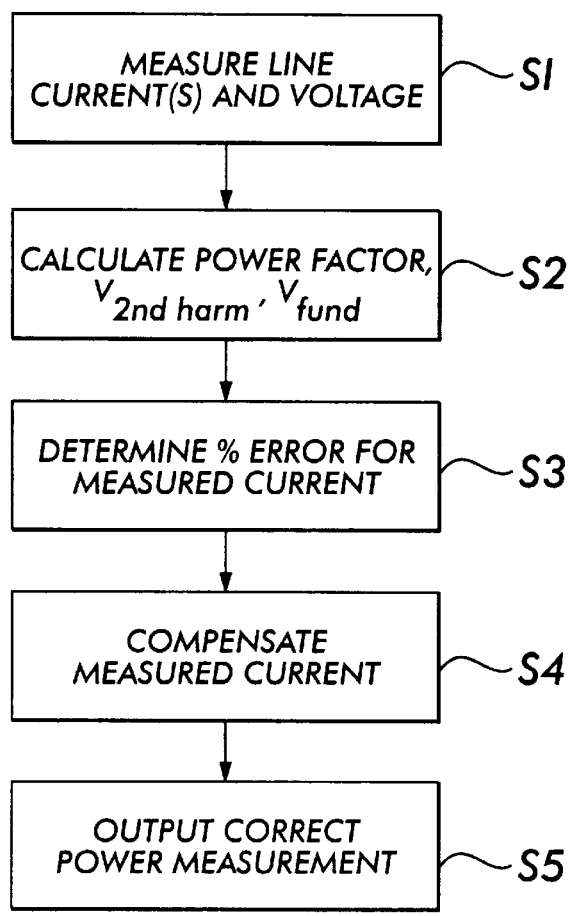
FIG. 2 is a flowchart of the operation of the current measuring system depicted in FIG. 1.

As shown in FIG. 1, a presently preferred embodiment of the invention is adapted to be coupled to a line 10 carrying a 60 Hz or 50 Hz current to be measured. Samples of the line current ($I_{MEAS}$) and voltage $V_{MEAS}$) are obtained by conventional means, e.g., a meter 12 employing an inexpensive current transformer (schematically shown at 13 in FIG. 1) sized to measure only AC current. According to the invention, a DSP or lookup table (memory) 14 is coupled to the meter 12, and a correction unit 16 is coupled to the meter 12 and DSP/lookup table 14. The operation of the system will be explained next with reference to the flowchart depicted in FIG. 2.

First, the meter 12 measures the line current and voltage (step S1). (Of course, in a three-phase system, the components depicted in FIG. 1 would be adapted to measure all three line currents and voltages.) Next, the power factor, second harmonic current and fundamental frequency (i.e., 60 or 50 Hz) current are determined and employed to generate voltage signals indicative of the respective values (step S2). Next, the percent error in the current measurement is calculated (step S3), and then this percent error value is employed to compensate the current measurement to obtain a corrected current measurement (step S4). Finally, the corrected current measurement is output and used for billing purposes. Of course, in a Watt-hour meter, the measured current is employed to calculate the amount of energy consumed by the customer.

Thus, the disclosed concept provides correction factors for the current transformer output based on the amount of second harmonic signal that is present. The invention recognizes that a correction algorithm can be determined empirically and implemented in a DSP or memory. The result achieved by this invention is that current sensing in the presence of second harmonic current is adjusted such that the measurement accuracy is similar to the accuracy obtained where no DC current is present. In this manner, core and transformer costs are maintained for AC currents while performance in the presence of DC current is improved.

Figure 3A:
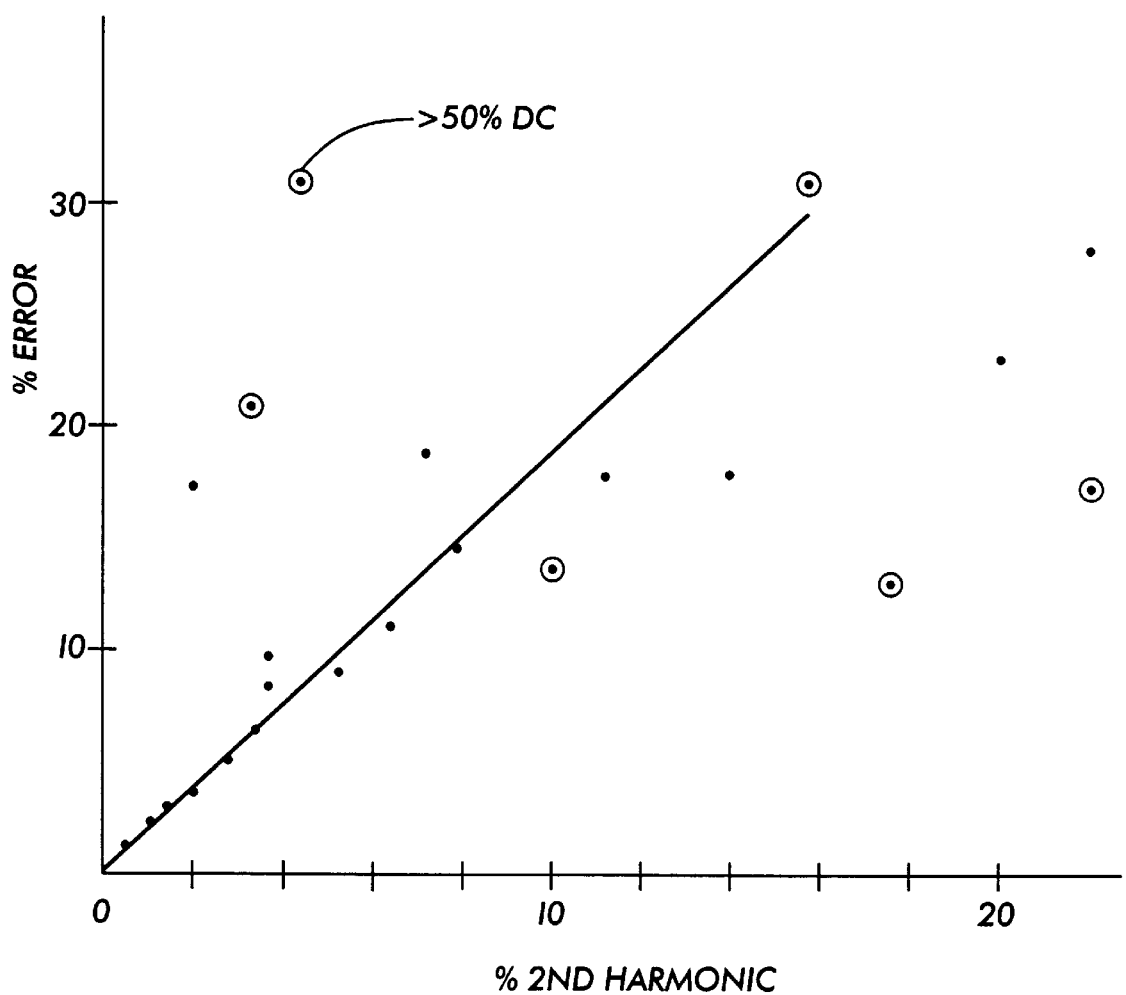
Figure 3B:
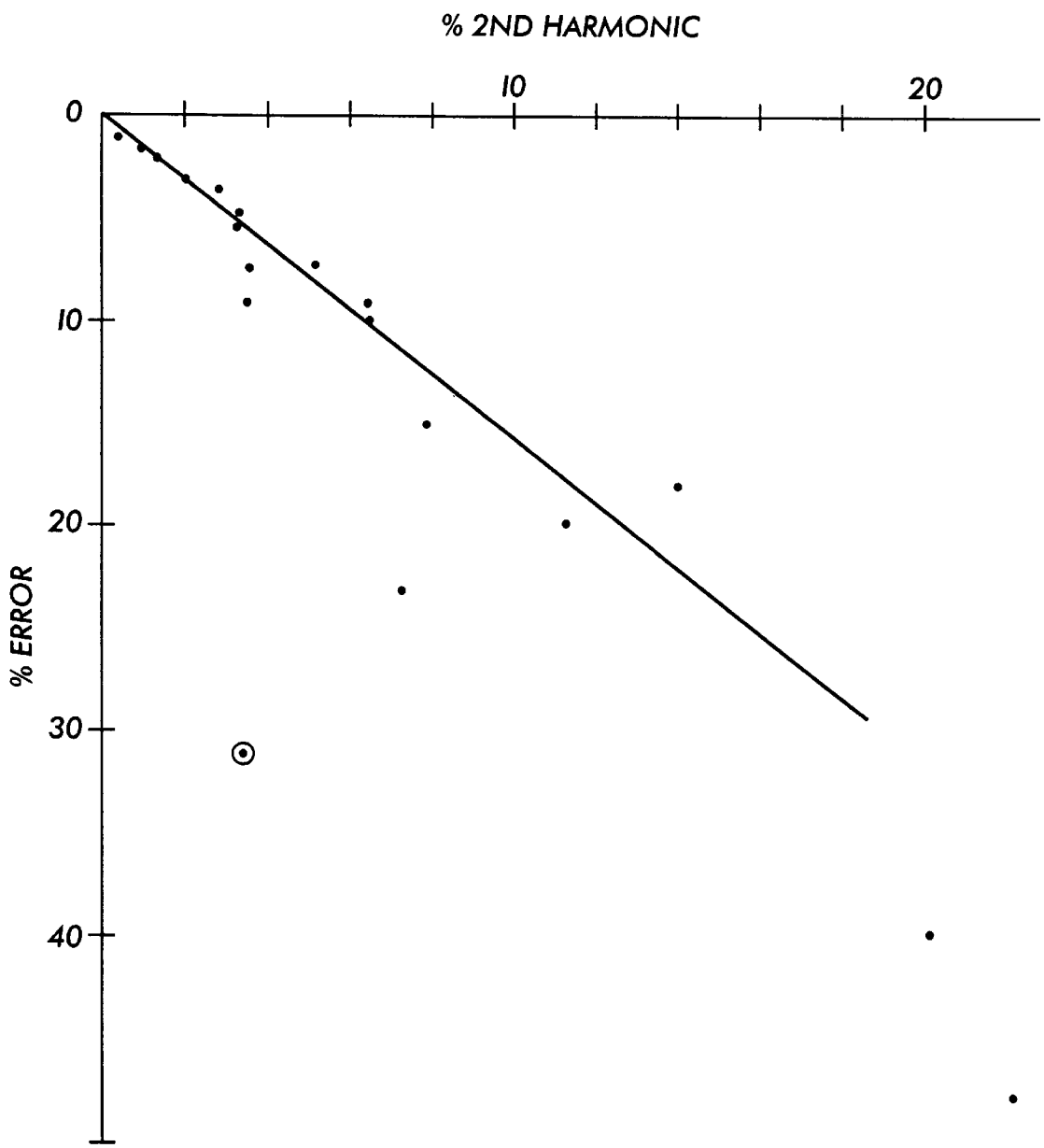

FIGS. 3A–3C depict the performance numbers for a solid state meter operating over a wide variety of different loading conditions. FIG. 3C relates to a power factor of unity and depicts data points relating the percent second harmonic current (x-axis) to the percent error in the fundamental frequency current measurement (y-axis). A straight-line approximation of the percent error is given by, $$\%\text{Error} = -67(V_{f2}/V_{f1}).$$

Similarly, FIGS. 3A and 3B relate to power factors of 60° and −37°, respectively, and the corresponding straight-line error equations are:

$$\%\text{Error} = 187(V_{f2}/V_{f1}), I_{DC} < 50\% \, I_{AC}, \text{ and}$$

$$\%\text{Error} = -160(V_{f2}/V_{f1}).$$

The testing begins with no DC current and then the DC current is increased to 14 amperes. These measurements are $$\%\text{ Error} = \left(-68 + \frac{(2.8 * \text{pwr factor in degrees})}{(1 + 2 * (V_{2nd\,harm}/V_{fund}))}\right) * (V_{2nd\,harm}/V_{fund})$$

This equation allows the DSP to calculate the percent error correction factor using the measured power factor; the amount of second harmonic current, as represented by voltage signal $V_{2nd\,harm}$; and the amount of fundamental current, as represented by voltage signal $V_{fund}$. This particular equation may not be the final implementation used for production units of a given system, but it is an example of a useful equation based on empirical data taken from several units.

An alternative approach is to develop a lookup table of percent error correction based on measured power factor, second harmonic voltage and fundamental voltage. The lookup table would be determined from large amounts of production data. The following table, which contains the data plotted in FIGS. 3A–3C, could be stored in a lookup table ROM or RAM.

| | $I_{DC}$ | $V_{f2}$ | $V_{f2}/V_{f1}$ | % Error for PF = Unity | | % Error for PF = +60° | | % Error for PF = −37° | |
|---|---|---|---|---|---|---|---|---|---|
| | | | | Meas | Calc | Meas | Calc | Meas | Calc |
| $I_{AC}$ = 5 A | 14 | .22 | 10 | −62% | −5.5% | 13.9% | 16.1% | −96.6% | −18.7% |
| $V_{CT}$ = 2.2 mv | 7 | .1 | 4.5 | −27 | −2.5 | 31 | 7.2 | −53 | −8.4 |
| | 3.5 | .07 | 3.2 | −15 | −1.8 | 21 | 5.2 | −31 | −6. |
| | 1.75 | .079 | 3.5 | −3.3 | −1.9 | 9.8 | 5.6 | −9.2 | −6.6 |
| $I_{AC}$ = 10 A | 14 | .79 | 17.6 | −62 | −9.7 | 13 | 28.3 | −94.3 | −32.9 |
| $V_{CT}$ = 4.5 mv | 7 | .71 | 15.8 | −26 | −8.7 | 31 | 25.4 | −52 | −29.6 |
| | 3.5 | .32 | 7.1 | −10 | −3.9 | 18.7 | 11.4 | −23 | −13.3 |
| | 1.75 | .16 | 3.6 | −2.7 | −2. | 8.4 | 5.8 | −7.5 | −6.7 |
| $I_{AC}$ = 20 A | 14 | 2.2 | 22 | −50 | −12.1 | 17.3 | 35.4 | −79 | −41 |
| $V_{CT}$ = 10 mv | 7 | 2.2 | 22 | −18 | −12.1 | 28 | 35.4 | −79 | −41 |
| | 3.5 | .79 | 7.9 | −6 | −4.3 | 14.5 | 12.7 | −15 | −14.8 |
| | 1.75 | .32 | 3.2 | −2 | −1.8 | 6.3 | 5.2 | −5.5 | −6. |
| $I_{AC}$ = 40 A | 14 | 5. | 20 | −21 | −11. | 23 | 32.2 | −4. | −38.4 |
| $V_{CT}$ = 25 mv | 7 | 3.5 | 14 | −7 | 7.7 | 18 | 22.5 | −18 | −26 |
| | 3.5 | 1.3 | 5.2 | −2.4 | −2.9 | 8.7 | 8.4 | −7.2 | −9.7 |
| | 1.75 | .32 | 3.2 | −1 | −1.1 | 3.7 | 3.2 | −3.1 | −3.7 |
| $I_{AC}$ = 100 A | 14 | 7.9 | 11.1 | −8.9 | −6.1 | 17.7 | 17.9 | −20 | −20.8 |
| $V_{CT}$ = 71 mv | 7 | 4.5 | 6.3 | −3 | −3.5 | 11 | 10.1 | −9 | −11.8 |
| | 3.5 | 2.0 | 2.8 | −1.1 | −1.5 | 5.2 | 4.5 | −3.8 | −5.2 |
| | 1.75 | .71 | 1. | −.6 | −.6 | 2.2 | 1.6 | −1.9 | −1.9 |
| $I_{AC}$ = 200 A | 14 | 8.9 | 6.3 | −3.4 | −3.4 | 11 | 10.1 | −10 | −11.8 |
| $V_{CT}$ = 141 mv | 7 | 4.5 | 3.2 | −1.2 | −1.8 | 6.4 | 5.2 | 4.5 | −6. |
| | 3.5 | 1.0 | 1.3 | −.45 | −.7 | 3 | 2.1 | −2 | −2.4 |
| | 1.75 | .71 | .53 | −.35 | −.3 | 1.3 | .8 | −1 | −.9 | utilized to correlate the amount of measurement error to the corresponding fundamental frequency current and DC current. FIGS. 3A–3C provide rough correlation plots of accuracy and its relationship to fundamental frequency and DC current levels. This data can be made sufficiently robust to be predictive in correction of performance errors.

The data files included in this disclosure are an example of the basic type of data that can be used for analysis of an algorithm to correct for DC current. The data includes the amount of error that is documented for different conditions of AC current magnitude and phase and DC current magnitude. Using these data, an equation or a lookup table can be developed which provides correction factors for the data. An example of such an equation follows:

We claim:

1. A method for measuring an AC current in a conductor in which a DC current also exists, wherein a power factor is determinable from said AC and DC currents and said AC current has at least a fundamental frequency current component and a second harmonic current component, comprising the steps of:

(A) obtaining a first AC current measurement;

(B) obtaining a measure of said power factor, fundamental frequency component, and second harmonic current component; and (C) adjusting said first AC current measurement in accordance with an error value to obtain a corrected AC current measurement, said error value being determined as a function of said power factor, fundamental frequency current component, and second harmonic current component.

2. A method as recited in claim 1, wherein said first AC current measurement is obtained with a current transformer operatively coupled to said conductor, the output of said current transformer being a signal ($V_{CT}$) indicative of the AC current in said conductor.

3. A method as recited in claim 2, wherein said error value is determined in accordance with the following equation:

$$\% \text{ Error} = \left(-68 + \frac{(2.8 * \text{pwr factor in degrees})}{(1 + 2 * (V_{2nd\,harm} / V_{fund}))}\right) * (V_{2nd\,harm} / V_{fund})$$

or other equation based on empirical data, wherein "%Error" represents the percent error in the first AC current measurement, and "$V_{2nd\,harm}/V_{fund}$" represents a ratio of the second harmonic current component to the fundamental frequency current component.

4. A method as recited in claim 1, wherein said power factor, fundamental frequency current component, and second harmonic current component are employed to access a lookup table containing said error value.

5. A system for measuring an AC current in a conductor in which a DC current also exists, wherein a power factor is determinable from said AC and DC currents and said AC current has at least a fundamental frequency current component and a second harmonic current component, comprising:
 (A) current transformer means operatively coupled to a said conductor for obtaining a first AC current measurement; and
 (B) processing means for obtaining a measure of said power factor, fundamental frequency current component, and second harmonic current component, and for adjusting said first AC current measurement in accordance with an error value to obtain a corrected current measurement, said error value being determined as a function of said power factor, fundamental frequency current component, and second current harmonic component.

6. A system as recited in claim 5, wherein an output of said current transformer is a signal ($V_{CT}$) indicative of the AC current in said conductor.

7. A system as recited in claim 5, wherein said error value is determined in accordance with the following equation:

$$\% \text{ Error} = \left(-68 + \frac{(2.8 * \text{pwr factor in degrees})}{(1 + 2 * (V_{2nd\,harm} / V_{fund}))}\right) * (V_{2nd\,harm} / V_{fund})$$

wherein "%Error" represents the percent error in the first AC current measurement; and "$V_{2nd\,harm}/V_{find}$" represents a ratio of the second harmonic current component to the fundamental frequency current component.

8. A system as recited in claim 5, wherein said power factor, fundamental frequency current component, and second harmonic current component are employed to access a lookup table containing said error value.

\* \* \* \* \*